United States Patent [19]

Bressert et al.

[11] Patent Number: 4,543,570
[45] Date of Patent: Sep. 24, 1985

[54] DETECTING A RAPID CHANGE OF A CRITICAL PHYSICAL CONDITION

[75] Inventors: Edgar Bressert, Schwieberdingen; Gerhard Gulich, Stuttgart; Helmut Martini, Weil der Stadt; Rudi Meny; Roland Sauer, both of Stuttgart; Rolf Wöhr, Leonberg, all of Fed. Rep. of Germany

[73] Assignee: Robert Bosch GmbH, Stuttgart, Fed. Rep. of Germany

[21] Appl. No.: 498,249

[22] Filed: May 26, 1983

[30] Foreign Application Priority Data

May 29, 1982 [DE] Fed. Rep. of Germany ....... 3220434

[51] Int. Cl.$^4$ ............................................. G08B 17/06
[52] U.S. Cl. ..................................... 340/589; 340/650; 340/661
[58] Field of Search ............... 340/584, 588, 589, 650, 340/632, 630, 661; 364/483; 361/93, 86; 371/20; 250/338

[56] References Cited

U.S. PATENT DOCUMENTS

| | | | |
|---|---|---|---|
| 3,594,557 | 7/1971 | Anderson | 340/632 X |
| 3,728,615 | 4/1973 | Hill et al. | 340/589 X |
| 4,099,165 | 7/1978 | Botnen | 340/589 |
| 4,266,220 | 5/1981 | Malinowski | 340/630 |
| 4,445,090 | 4/1984 | Melocik | 364/483 X |
| 4,454,557 | 6/1984 | Hurley | 361/93 |

FOREIGN PATENT DOCUMENTS 2294571  7/1976  France .

Primary Examiner—James L. Rowland
Assistant Examiner—Daniel Myer
Attorney, Agent, or Firm—Frishauf, Holtz, Goodman & Woodward

[57] ABSTRACT

Instead of monitoring a thermal deburring operation by reference to whether a certain high temperature is reached and thereby indicting whether a successful ignition in the deburring chamber has taken place at every step of operation of the chamber, a circuit responsive to the rate of change of temperature is used to recognize a successful operation, thus permitting faster operation of the apparatus. Such a circuit is also useful for rapid detection of a short circuit circuit in electrochemical apparatus utilizing heavy electrical currents and variable amounts. In the latter case a digital circuit for measuring the amount of change at equal intervals of time is particularly useful.

2 Claims, 5 Drawing Figures

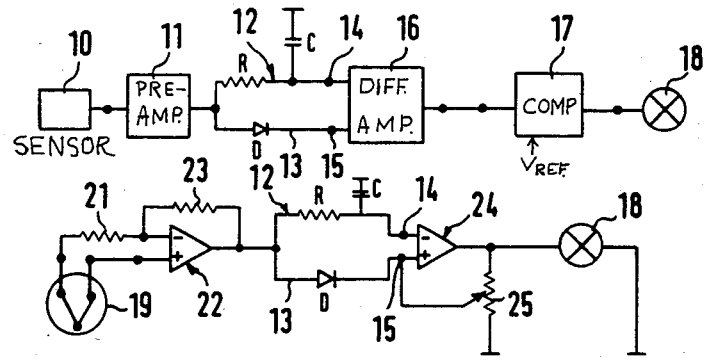
FIG. 1
FIG. 2
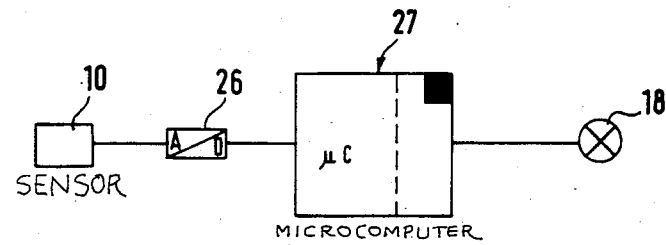
FIG. 3
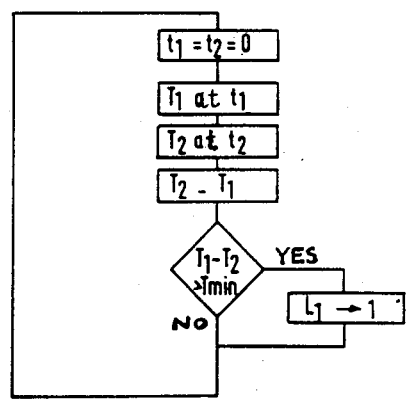
FIG. 4
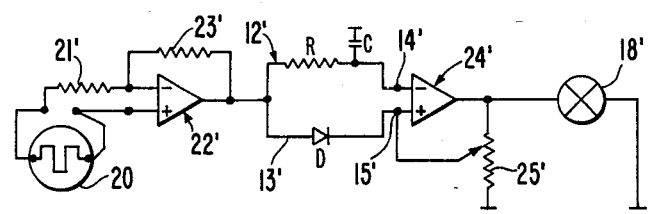
FIG. 5

DETECTING A RAPID CHANGE OF A CRITICAL PHYSICAL CONDITION

This invention concerns monitoring methods for industrial processes in which it is necessary to detect rapidly occurring changes in a critical physical condition, such as a temperature change of the kind occurring upon ignition of combustion or a change in the value of an already large electric current such as occurs when there is a short circuit.

In the past threshold devices have been used in connection with electrical systems for rapid measurement of temperature so that as soon as the temperature exceeds a pre-determined limit, a signal will be provided, or in the case of an electrical current, a threshold switch will be operated as soon as the electrical current exceeds a pre-determined maximum.

Such arrangements have been found unsatisfactory in a particular industrial processes. In the case of thermal deburring of manufactured metal parts made in large quantities, where the parts are fed through a machine in which each part is briefly put into a deburring chamber in which an explosive mixture of gases is fed and then ignited, it is important to know of any failure of the mixture to ignite, because that means that in that instance the corresponding part was not deburred and, furthermore, a failure of ignition indicates unreliability of the apparatus. Since the apparatus heats up as it is used, it may get hot enough to produce a false indication of combustion in the monitoring system and if the threshold is raised to assure that no such results will happen, an adequate combustion may sometimes fail to register.

THE INVENTION

It is an object of the present invention to provide a method of detecting change of temperature which will detect that change just as rapidly when the temperature is small as when it is very large, so that the monitoring system can operate more reliably and more quickly.

Briefly, the electrical signal of a measuring device that shows the instantaneous value of temperature is procecessed to reveal the amount of change per unit of time and then is caused to operate a threshold switch or the like to register an output when the amount of change per unit of time exceeds a pre-determined value. In a method of monitoring a thermal deburring operation an electrical circuit of the "analog" type is used, according to the invention to provide an economical and reliable system for detecting a failure of the explosive mixture to ignite and, therefore, a failure of a part to be treated.

More specifically, an electrical voltage representative of instantaneous temperature is supplied to the two oppositely acting inputs of a differential amplifier, to one of those inputs through a delay network or circuit and into the other of those inputs through a circuit adding no substantial delay but incorporating a diode so as to transmit only changes of voltage in one sense. The differential amplifier is provided with a variably settable resistive positive feedback circuit branch so that the differential amplifier itself is connected as a hysteresis switch. As a result the differential amplifier will both respond with a signal when a difference signal of predetermined magnitude is formed and then maintain the output signal until the difference of the two outputs either disappears or goes to some other very low value.

THE DRAWING

The invention is further described by way of illustrative example with reference to the annexed drawings, in which:

FIG. 1 is a circuit block diagram of the method of the invention for monitoring thermal deburring;

FIG. 2 is a circuit diagram of a preferred embodiment of the method for monitoring a thermal deburring operation;

FIG. 3 is a block diagram of apparatus for carrying out the digital method of monitoring an electrochemical operation for short circuits in accordance with the invention;

FIG. 4 is a flow chart relating to the operation of the microcomputer shown in FIG. 3;

FIG. 5 is a modification of FIG. 2.

DESCRIPTION OF THE ILLUSTRATED EMBODIMENTS

The block diagram of FIG. 1 representing a method of monitoring a deburring operation shows a thermometric device 10 having an electrical output, a pre-amplifier 11, a differential amplifier 16, a comparator 17 and a registering indicator 18 which can conveniently be a suitably placed lamp. The signal produced by the device 10 is amplified in the amplifier 11, the output of which goes through a delay network 12 to one input 14 of the differential amplifier and also goes from the output of the pre-amplifier 11 without delay, through a diode D to another input 15 of the differential amplifier. The output of the differential amplifier 16 is proportional to the difference between the signals at its inputs 14 and 15 and that output is compared in the comparator 17 with a reference value of voltage from a source provided within the comparator and therefore not shown in the drawing. The output of the comparator 17 is connected to the lamp 18.

When combustion takes place in the vicinity of the thermometric device 10, regardless of the temperature in the device when combustion starts, a rapidly changing signal is provided and amplified by the pre-amplifier 11. In the circuit branch 13 the diode D produces a constant voltage drop of 0.7 volts, whereas in the circuit branch 12 a resistance-capacitance network is provided which delays the output signal of the pre-amplifier 11 and delivers it in delayed form to the differential amplifier. When there is a rapid rise of the signal from the device 10 the voltage rise at the input 14 of the differential amplifier 16 will be delayed relative to the voltage rise at the input 15 of the differential amplifier, so that the resulting voltage difference will exceed some pre-determined value. The comparison of the resulting voltage difference which the pre-determined reference value is carried out in the comparator 17, so that in the case of a sufficiently rapid rise of the temperature in the thermal deburring chamber the lamp 18 will flash and the operator will note that a normal deburring cycle has been completed. Failure of the lamp to light will also quickly be noted. Of course the lamp could be caused to light only in case of failure, in which case its lighting may be prolonged by a suitable circuit.

FIG. 2 shows a simplified and preferred circuit for performing the functions of the embodiment of FIG. 1. In this case the thermosensitive element is either a thermocouple 19 or a thermistor (temperature sensitive resistor) 20. The output voltage of the thermocouple 19 or the thermistor 20 is supplied through an input resistance 21 to both inputs of an operational amplifier 22. A feedback resistance 23, connected between the output of the amplifier 22 and its inverting input, provides stabilizing negative feedback. The operational amplifier 22 constitutes the pre-amplifier 11 of FIG. 1 and accordingly supplies its output to the two circuit branches 12 and 13 that are constituted in the same manner as in FIG. 1, namely with a RC delay circuit in the branch 12 and a diode D in the branch circuit 13. The terminals 14 and 15 are connected to the respective inputs of an operational amplifier 24, which in this case constitutes at the same time the differential amplifier 16 and the comparator 17 of FIG. 1. Its output is connected to a resistance 25 which has a variable tap connected to the non-inverting input of the operational amplifier, thereby providing positive feedback and making the operational amplifier 24 operate as a hysteresis switch. A variation of the resistance in the circuit between the output of the operational amplifier and its non-inverting input produces a variation in the switching hysteresis of the operational amplifier.

The device to be switched by the operational amplifier, which is connected to the output of the latter, is again shown as a lamp 18, in this case with its other terminal shown connected to ground, but it must be understood that an automatic system for dealing with a short circuit in an electrochemical device could be similarly connected to the output of the operational amplifier 24.

The circuit of FIG. 2 operates in the same fashion as that of FIG. 1. A thermocouple as shown at 19 is preferred for use in a thermal deburring installation as the thermosensitive element. A resistor could be used in this same circuit, for example, the thermistor 20 as in FIG. 5 or, if this circuit were to be used for detection of short circuits in an electro-chemical installation, in which case the resistor 20, in this case of low value, appearing in FIG. 5 would be placed in shunt with some impedance in the electrical circuit in order to provide a signal representative of the amount of current flowing in the electrochemical system.

A voltage value delivered to the pre-amplifier 22 is applied in parallel to the circuit branches 12 and 13. When there is a rapid change producing a rise in voltage, the voltage of the terminal 14 at first does not change appreciably because of the delay imposed by the RC network in the circuit branch 12, whereas in the circuit branch 13, after deduction of a voltage drop of 0.7 volts at the diode D the voltage rise is immediately applied to the input 15 of the operational amplifier 24. With a sufficiently rapid and strong change of the signal of the device 19 or 20 exceeding a prescribed comparison magnitude set into the circuit by means not shown, or else determined by the inherent operation characteristics of the operational amplifier 24, the operational amplifier switches its output signal from one extreme to another and the output device 18 is activated (for example the lamp 18 flashes on to show a successful deburring operation, or if the circuit is used to detect a short circuit, a safety device for protection against short circuits, not shown, is activated).

The circuits of FIG. 1 and FIG. 2 have the advantage of operating rapidly regardless of the level of the signal from which the rapid rise begins, whereas the type of monitoring that depends upon reaching a signal of a magnitude greater than all normal magnitudes of the signal naturally operates more slowly when the signal rises from a low level than when it rises from a high level and when the critical level is set rather high in order to avoid false indications when the static level is high, a rapid rise from a low level might be missed in the case of a thermal deburring operation. In the use of the circuit of the invention to monitor a thermal deburring operation, the temperature compensation that is sometimes used with the monitoring system depending upon whether a particular high temperature is reached can now be suspended with. Furthermore, since the circuit of the present invention operates more rapidly, especially at low temperatures of the apparatus, the rhythm of the deburring operation can be substantially faster.

FIG. 3 illustrates a digital method of dynamically monitoring a measurement of a variable physical magnitude that is to be kept within certain bounds. As previously mentioned it is particularly well suited for detecting short circuits in electrochemical equipment quickly. The sensor 10 is in this case a device that provides an output signal proportional to the current, which in the case of an electrochemical process can have a normal range extending into many thousands of amperes of current. The output of the measuring device 10 is provided to an analog-to-digital converter 26 and the resulting digital signal is supplied to a microcomputer 27 which contains the necessary storage, access and computation capability for processing the digital signals it receives. In the microcomputer 27 the digital value present at moments of time following each other at equal intervals of time are utilized for continuous computation of the difference between the signal values at successive moments of the sequence. There is also a continuous comparision of the difference with a predetermined critical value thereof, with the provision of a control signal at the output when the critical value is exceeded, this being shown symbolically by the connection to the lamp 18. The analgo-to-digital converter and the microcomputer 27 are both well knon devices and their operation needs not to be described further here. The microcomputer 27 may be constituted by the type 8085 microcomputer available from Intel.

FIG. 4 shows the flow diagram which may define the programming of the microcomputer 27 and also explains its manner of operation when so programmed.

FIG. 4 shows, in the top rectangle of the flow diagram that initially both the registers for the value $t_2$ of the real time signal and the value $t_1$ of the last previous sample are 0. The next rectangle shows that in the registers $t_1$ the value $T_1$ is entered. The next rectangle shows that in the register $t_2$ the value $T_2$ is entered. The fourth rectangle shows that the value $T_1$ is subtracted from the value $T_2$ and the diamond below it shows that the difference is then tested to see whether it is greater than a critical value $T_{min}$. If the decision is in the affirmative, an output $L_1$ is set to the higher of two possible output values, represented by the logic value 1. The cycle is then repeated, with the current or real time value always going in the register $t_2$ and the last previous value into the register $t_1$. Since these measurements can be made in overlapping pairs, the registers $t_1$ and $t_2$ can be successive cells of a two-place shift register, if it should be desired to utilize a simple logic circuit rather than a microcomputer.

Although the invention has been described with reference to certain illustrative embodyments, it will be understood that variations are possible within the inventive concept.

We claim:

1. Apparatus for detecting the occurrence of combustion in a thermal deburring apparatus, comprising
   means for producing an electrical signal representative of the temperature in a thermal deburring chamber in a manner responsive to rapid changes ot temperature (10, 11; 19-23);
   a differential amplifier (16, 24) having an output and having first and second inputs (14, 15) of mutually opposite effect on said output;
   delay circuit means (12) for delaying said signal and applying the delayed resulting signal to said first input (14) of said differential amplifier;
   electrical connecting means (13) having a diode (D) interposed therein for supplying without substantial delay to said second input (15) of said differential amplifier a rectified portion, representative of temperature rise, of said temperature representative signal;
   means, comprising a variable resistance network connected to the output and one of said inputs of said differential amplifier selected for providing positive feedback, for applying variably settable positive feedback to said differential amplifier and causing the latter to operate as a hysteresis threshold switch, and
   a device for indicating at least one switching condition of said differential amplifier.

2. Apparatus according to claim 1 in which said resistance element (25) is a potentiometer connected as a load for said output of said differential amplifier (24) having its tap terminal connected to the non-inverting input of said differential amplifier.

* * * * *